May 23, 1967 J. R. BIARD ETAL 3,321,631
ELECTRO-OPTICAL SWITCH DEVICE
Filed Nov. 29, 1963 2 Sheets-Sheet 1

JAMES R. BIARD,
EDWARD L. BONIN
INVENTORS

BY John D. Graham

ATTORNEY

JAMES R. BIARD,
EDWARD L. BONIN
INVENTORS

BY John J. Graham

ATTORNEY

United States Patent Office 3,321,631

Patented May 23, 1967

3,321,631

ELECTRO-OPTICAL SWITCH DEVICE

James R. Biard and Edward L. Bonin, both of Richardson, Tex., assignors to Texas Instruments Incorporated, Dallas, Tex., a corporation of Delaware Filed Nov. 29, 1963, Ser. No. 327,137
12 Claims. (Cl. 250—209)

The present invention relates generally to a device for providing interstage coupling between electrical circuits which are completely electrically isolated from each other. More particularly, it relates to an electro-optical transistor switch having a pair of input terminals for actuating the switch and a pair of output terminals across which the switch is closed in response to optical radiation which are completely electrically isolated from the input terminals. The switch can be opened and closed at a very high frequency rate, with a switching speed which is independent of the magnitude of the load through which current is being switched, and provides versatility in its application to electrical systems in which it is advantageous not to refer the input and output terminals of the switch to the same reference potential source.

Transistors are used extensively as switches in electronics, especially in digital circuitry, wherein they are used in conjunction with resistors and diodes to perform various logic functions. In performing logic functions with various transistor switches, it would be desirable, in many cases, to provide a logic block wherein a plurality of such switches are connected in series or parallel fashion or both, and as many inputs to the logic block are provided as there are switches. The number of inputs is commonly referred to as the degree of fan-in, such as a fan-in of three when there are three inputs. Unfortunately, a very large fan-in cannot be achieved in such cases using conventional circuitry. For example, converting a plurality of transistor switches in series and providing an input to each transistor to achieve an "AND" function requires a successively greater input voltage signal to each successive transistor in order to obtain sufficient driving current to turn it on. The reason for this is the fact that the transistors are connected in series to a reference potential and the driving source for each transistor is also referred to the same reference potential. Another limitation resulting from having a common reference potential for an entire logic block or logic section is that circulating ground currents produce spurious voltages that are of the same order of magnitude of the logic signals, which increases the percentage of errors and erroneous switching in logic circuitry. Thus, logic circuitry connections are greatly limited by the fact that complete electrical isolation is not achieved between various stages and components of the circuit.

There is described in the co-pending application of Biard et al., entitled, Electro-Optical Coupling Device, Ser. No. 327,136, filed concurrently herewith and assigned to the same assignee, a system for providing complete electrical isolation between various electrical circuitry to overcome the problems noted above. This system basically includes a photosensitive, semi-conductor active junction device used as a linear element or as a switching device which is optically coupled to a solid-state, semiconductor diode light source for activating the switch. The preferred embodiment of the system uses a photosensitive transistor as the active junction device, in which the transistor preferably has a relatively large collector-base junction to provide a high collection efficiency of the light emitted by the diode light source. Although rapid switching action can be achieved in this system, the switching speed will be dependent, at least to some extent, on the magnitude of the load impedance through which a current is switched if the collector-base capacitance of the photosensitive transistor is very large. It follows that this capacitance is increased for increased collector-base junction area, and the greater the impedance through which a current is switched, the slower the switching speed. The dependance is generally a result of the collector-base junction capacitance being charged to a voltage whose magnitude depends upon the magnitude of the load impedance.

The transistor switch used in conventional circuitry is normally controlled by a signal applied between the emitter and base terminals. Moreover, the transistor can be designed with a high forward gain for high frequency operation, the latter which governs its greatest switching speed. In essence then, the conventional transistor switch has a relatively small collector-base capacitance which affects its switching speed little, if any, as the load impedance changes.

There is provided by the present invention a coupling system that utilizes, in its preferred embodiment, a conventional high gain, high frequency transistor as a switching element whose switching speed is independent of the magnitude of the load impedance through which a current is switched. Moreover, the present invention provides an electro-optical coupling system having completely electrically isolated input and output terminals for lending versatility in circuitry applications. The invention comprises a conventional transistor and means coupled to the transistor for generating a forward current bias across the emitter-base junction thereof in response to optical radiation. Optically coupled to the bias generating means is a solid-state, semiconductor junction diode means that emits optical radiation of a characteristic wavelength when a forward current bias is caused to flow through its junction, and is used as the driving source for operating the switch. Thus, complete electrical isolation between the input and output terminals of the switch is achieved. Since the bias generating means must develop a voltage only large enough to forward-bias the emitter-base junction of a conventional, high switching speed transistor without having to supply current to charge a large collector-base junction capacitance, the switching speed is made independent of the load impedance magnitude. Moreover, because of the solid state nature of the diode light source, the switch can be made economically and of very small dimensions. The intensity of the light emitted by the diode can be modulated at an extremely high frequency by the application to its input terminals of a high frequency series of pulses. Thus, fast switching action can be achieved in the switch for applications to fast logic circuitry.

Other objects, features and advantages of the present invention will become apparent from the following detailed description thereof when taken in conjunction with the appended claims and the attached drawings in which like reference numerals refer to like parts throughout the several figures, and in which:

Figure 6:
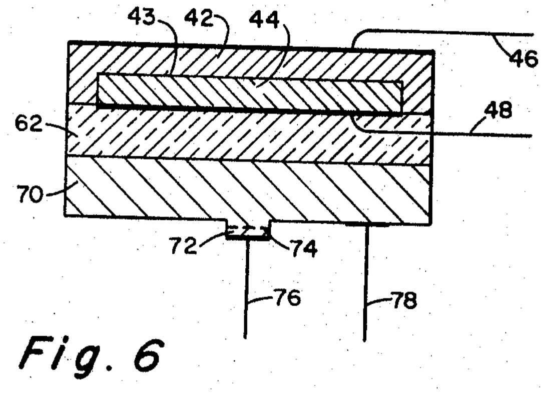
Figure 4:
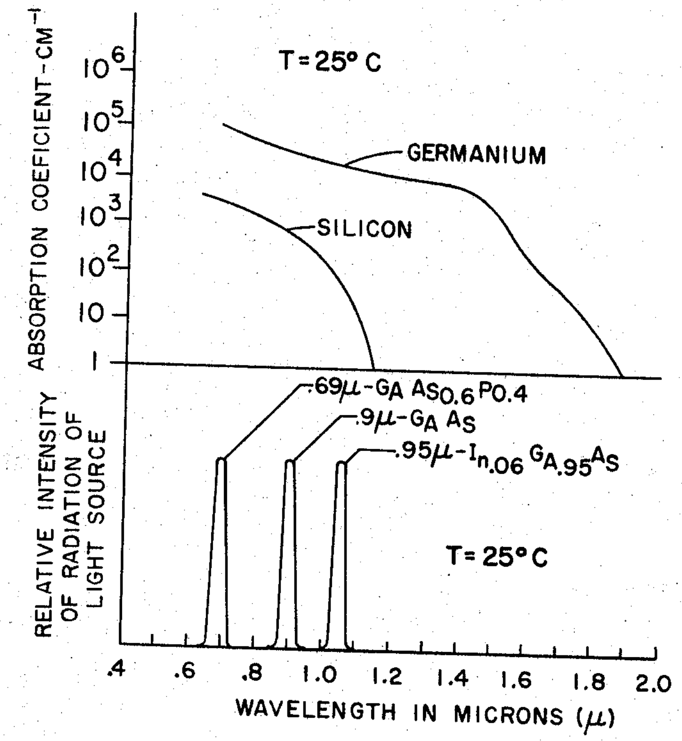
Figure 5:
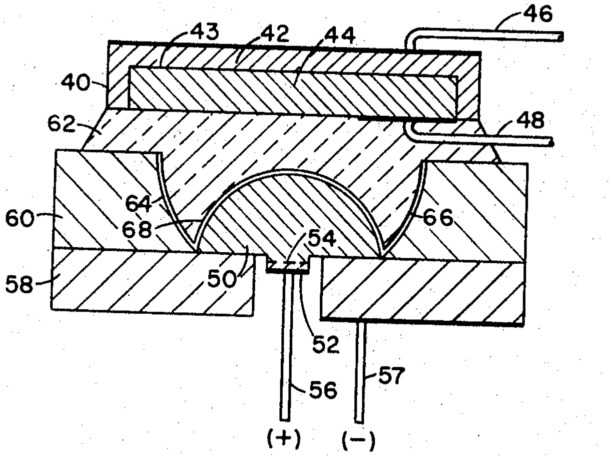

FIGURE 4 are graphical illustrations of the relative absorption coefficent of optical radiation as a function of wavelength for the semiconductor materials silicon and germanium as compared to the relative intensity of optical radiation as a function of wavelength for three different light emitting diodes comprised of gallium-arsenide-phosphide ($GaAs_{0.6}P_{0.4}$), gallium-arsenide (GaAs), and indium-gallium-arsenide ($In_{.05}Ga_{.95}As$);

FIGURE 5 is an elevational view in section of one embodiment of the portion of the coupling system which includes a light emitting diode and a photosensitive diode; and FIGURE 6 is an elevational view in section of another embodiment of the light emitting diode and a photosensitive diode.

Figure 1:
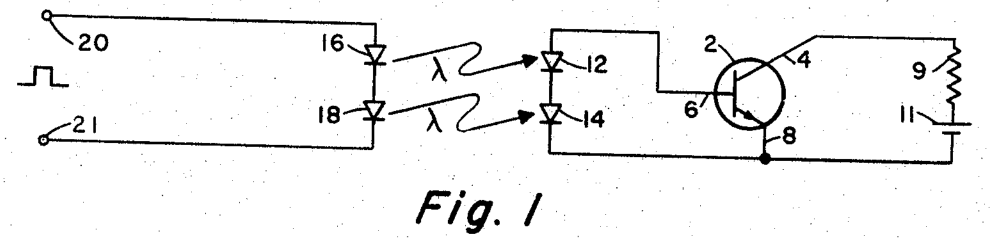
FIGURE 1 is an electrical schematic diagram of an embodiment of the invention having a single pair of input control terminals.

Referring now to FIGURE 1, there is shown an n-p-n transistor 2 having a collector 4, base 6 and emitter 8 with a pair of serially connected semiconductor diodes 12 and 14 connected across the base-emitter junction thereof. The anode of diode 12 is connected to the base 6 of the transistor, and the cathode of diode 14 is connected to the emitter. A potential source 11 is connected in series with a load impedance 9 and the collector 4 with polarity as shown, wherein the transistor switches current from the supply 11 through the load impedance 9 when it conducts. The load impedance 9 and potential source 11 are shown schematically to represent the equivalent of any circuit, in general, to which the transistor 2 is to be connected. Optically coupled to the diodes 12 and 14 are a pair of serially connected solid-state, semiconductor junction diodes 16 and 18, respectively, and are characterized by the emission of optical radiation of a characteristic wavelength when a forward current bias is caused to flow through the junctions thereof, such as by the application of a positive voltage pulse to terminal 20 connected to the anode of diode 16 with respect to terminal 21 connected to the cathode of diode 18. The terminals 20 and 21 are connected to another circuit having an output for driving the light sources 16 and 18 and which is electrically isolated from the circuit including the transistor. Diodes 12 and 14 are photosensitive and are forward biased when optical radiation from the junction diodes 16 and 18, respectively, impinges thereon. That is to say, the diodes 12 and 14 are photosensitive because of their semiconductor properties in that light of a suitable wavelength, when absorbed thereby, will create hole-electron pairs. These charge carriers, when collected at the junction of the diode cause the junction to become forward biased. For purposes of the present invention, the terms light and optical radiation are used interchangeably and are defined to include electromagnetic radiation in the wavelength region from the near infrared into the visible spectrum. The creation of a forward bias across diodes 12 and 14 causes a sufficient flow of current to the base 6 of the transistor to produce a forward bias at the base-emitter junction.

To achieve complete electrical isolation between the input and output terminals of a switch by means of optical radiation, the radiation can be made to impinge directly on a photosensitive transistor in order to generate forward bias for causing it to conduct, as described in the above copending application. In such a case, however, the collector-base junction may represent a relatively large capactior that has no initial charge on it when the transistor is non-conductive. As the transistor turns on as a result of radiation incident thereon, the collector voltage for an n-p-n transistor drops to a lower value, depending upon the size of the load connected in the collector circuit. Thus, the collector-base junction capacitance must be charged to a voltage equal to the difference in voltage at the collector when in a non-conductive state and the voltage at the collector when it is conducting. The optical radiation impinging on the transistor to forward bias it to conduction is essentially constant in intensity and produces a photocurrent equivalent to a constant current source. That is to say, the optical radiation produces photocurrent in the transistor, and it is the only current available to charge the collector-base capacitance. Since the collector-base capacitance must be charged to the collector voltage before the transistor completely turns on, it can be seen that the time required to charge the capacitance depends upon the voltage to which it must be charged, which, in turn, depends upon the magnitude of the collector voltage swing between non-conduction and conduction. As noted above, the change in voltage at the collector depends upon the load resistance, and for a large collector-base capacitance, the turn-on or switching time may be slower than desired. A characteristic of such a switch can thus be seen to be a switching speed which varies as the collector load impedance is varied.

The present invention, as shown in FIGURE 1, is an improvement over such a switch in that the switch may be turned on at a rate independent of the magnitude of the load impendance connected in the collector circuit. This is accomplished by using a conventional high gain, high frequency transistor in which the collector-base capacitance is very small and which is capable of being switched on at a rate essentially independent of the load impedance magnitude. Moreover, the invention preserves the desirable characteristic of completely electrically isolated input and output terminals with the use of optical coupling therebetween by employing the photosensitive means connected across the base-emitter junction of the transistor which generates the necessary bias in response to the optical radiation.

In order to understand the invention more fully, assume, for purposes of explanation, that a single photosensitive diode is connected between the base and emitter of the transistor. Optical radiation incident upon the photosensitive diode produces a photocurrent equivalent to a constant current generator in parallel with the junction of the diode. Since the photosensitive diode is connected in parallel with the base-emitter junction of the transistor, the diode junction and the base-emitter junction of the transistor share the photocurrent. If the area of the photosensitive diode is much larger than the base-emitter diode of the transistor, which it normally is, most of the current will normally flow through the diode junction and very little through the base-emitter junction of the transistor. Thus, in effect, the photocurrent turns the photosensitive diode on and the majority of this current flows back through the diode instead of through the transistor. The current that does flow through the transistor is normally insufficient to forward bias the transistor to conduction.

An inspection of the characteristic curves for a junction diode shows that in the region between non-conduction and condition, a small increase in voltage for a conducting diode produces a large increase in current. Conversely, by reducing the voltage across the diode by a few tenths of a volt, the current that will flow through the diode is reduced by a large factor. In fact, reducing the forward bias on most junction diodes by at least 60 millivolts in the conduction and non-conduction transition region of one order reduces the forward current that will flow therethrough by a factor of one order of magnitude. By using two photosensitive diodes connected in series and forward biasing each diode by only half the voltage of a single diode, the current which passes through the diodes is greatly reduced. The amount of voltage required across the base-emitter junction of a high gain, high frequency transistor to cause it to conduct is only a few tenths of a volt. Thus, a forward bias of only half as much voltage on each of two serially connected diodes as shown in FIGURE 1 will produce the required voltage, wherein the current that can flow through the diodes has been greatly reduced. Since very little of the photocurrent now passes through the diodes 12 and 14, there is sufficient current to bias the transistor to conduction. It should be noted, however, that in certain instances, a single diode will be sufficient to turn on the transistor, depending upon the particular materials and construction of the semiconductor devices. In addition, it is to be noted that although the photosenstive diodes may have large junction capacitors similar to the large base-collector junction capacitance of the transistor, the diode capacitors only have to be charged to the small voltage required to forward bias the transistor. As a consequence thereof, the switching speed of the system is independent of the collector load impedance.

As will be described below in more detail, the light emitting diodes 16 and 18 are solid-state, semiconductor devices that are efficient light sources in which the intensity of the light generated thereby can be modulated at a frequency as high as several thousand megacycles. Although a separate light source has been shown for each photosensitive diode connected to the transistor, it is to be understood that a single light source can provide the optical radiation necessary for several detector diodes, if desired.

Figure 2:
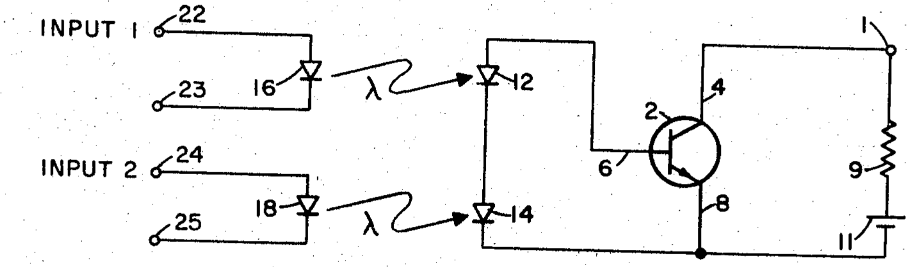
FIGURE 2 is an electrical schematic diagram of another embodiment having two pairs of input control terminals.
Figure 3:
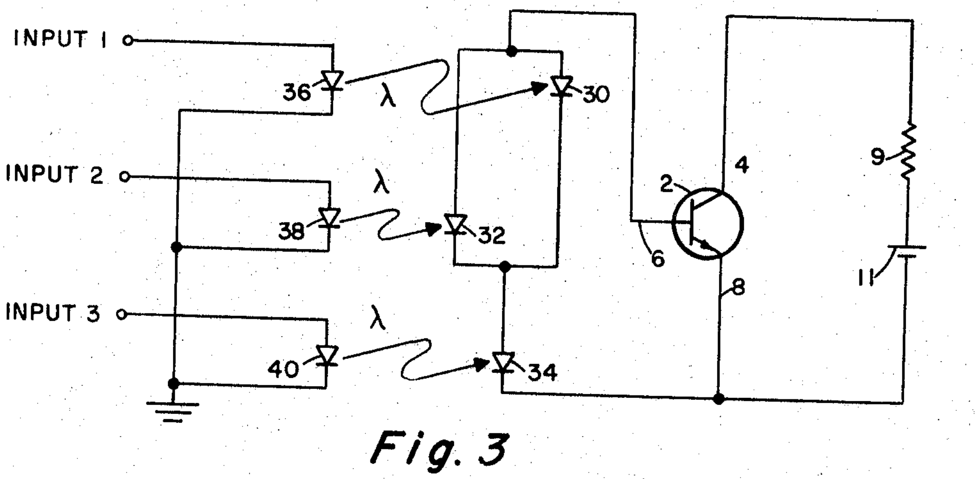
FIGURE 3 is an electrical schematic diagram of yet another embodiment having three pairs of input control terminals.

The light emitting diodes 16 and 18 have been shown connected in electrical series in FIGURE 1 to provide a single pair of input terminals to the switch. However, the diodes 16 and 18 can be connected in parallel or in independent circuits as shown in FIGURE 2 to provide two pair of independent input terminals. Thus, the switching circuit is capable of providing an "AND" function, where input signals are required across both terminals 22 and 23 of diode 16 and terminals 24 and 25 of diode 18 before photocurrent will bias the transistor to conduction. The circuit can be further extended to include as many photosensitive diodes connected across the base-emitter junction of the transistor as desired to perform any logical function. For example, two photosensitive diodes 30 and 32 can be connected in parallel and in series with a third photosensitive diode 34 as shown in FIGURE 3, and this combination is connected across the base-emitter junction of the transistor 2. An illuminating diode is provided for each of the photosensitive diodes, wherein diode 36 illuminates photosensitive diode 30, diode 38 illuminates photosensitive diode 32, and diode 40 illuminates photosensitive diode 34. Each of the illuminating diodes has independent input terminals, as shown. Illumination of either of diodes 30 or 32 in addition to diode 34 provides the required bias to cause the transistor to conduct. In other words, a signal at input 1 or a signal at input 2 to illuminating diodes 36 and 38, respectively, in conjunction with a signal to input 3 across illuminating diode 40 causes the transistor to conduct and the switch to close. Many other electrical connections and combinations are possible to produce any desired logic function.

A light emitting junction diode comprised of GaAs is described in an earlier co-pending application of Biard et al., entitled, Semiconductor Device, Ser. No. 215,642, filed Aug. 8, 1962, assigned to the same assignee, and is an example of a suitable solid-state light source such as diodes 16 and 18 of FIGURE 1. As will be described hereinafter in more detail, the diode can be comprised of other semiconductor materials to produce optical radiation of different wavelengths. As described in said earlier co-pending application, the diode comprises a body of semiconductor material, which contains a p-n rectifying junction. A forward current bias, when caused to flow through the junction, causes the migration of holes and electrons across the junction, and recombination of electron-hole pairs results in the generation of optical radiation having a characteristic wavelength or photon energy approximately equal to the band gap energy of the particular semiconductor material from which the diode is fabricated. It will be noted from this co-pending application that the generation of optical radiation in the diode is caused by a forward current bias at the junction and is an efficient solid-state light source as contrasted to light generated by other mechanisms, such as reverse biasing the junction, avalanche processes, and so forth. The relative intensity of radiation as a function of wavelength for optical radiation generated by a gallium-arsenide p-n junction diode is shown in the lower graph of FIGURE 4, where it can be seen that the radiation intensity is greatest at a wavelength of .9 micron. A typical curve of the relative coefficient of absorption of light as a function of wavelength for silicon and germanium are shown in the upper graph of FIGURE 4, where it can be seen that the .9 micron wavelength radiation generated by a gallium-arsenide diode will be absorbed by a body comprised either of silicon or germanium. Similar curves are shown for light generated by diodes comprised of gallium-arsenide-phosphide $$(GaAs_{0.6}P_{0.4})$$

and indium-gallium-arsenide ($In_{.05}Ga_{.95}As$), where it can be seen again that either a germanium or silicon body will absorb the light of wavelengths of .69 micron and 0.95 micron, respectively. These compositions are enumerated as examples only, and other useful compositions will be described below. It will also be noted from the graphs of absorption coefficients that before any appreciable absorption occurs in silicon or germanium, the photon energy must be at least slightly greater than the band gap energies of silicon and germanium, respectively. The band gap energies for silicon and germanium are 1.04 ev. and .63 ev., respectively. The graphs of FIGURE 4 show that absorption begins in silicon at a wavelength of about 1.15 microns, which corresponds to a photon energy of about 1.07 ev., and increases with shorter wavelengths; and absorption begins in germanium at about 1.96 microns, which corresponds to a photon energy of about .64 ev., and increases with shorter wavelengths. These two energies are greater than the respective band gap energies of the two materials, which clearly indicates the band-to-band transitions of electrons upon absorption, which is the type absorption with which the invention is concerned.

Since the optical radiation generated by the diode must be absorbed by the photosensitive diodes connected across the base-emitter junction of the transistor diodes to become forward biased, it is important to consider in more detail the absorption phenomenon which will more clearly illustrate the invention and its advantages. It can be seen from FIGURE 4 that the coefficient of absorption of light is less for longer wavelengths and, therefore, penetrates to a greater depth in a body of semiconductor material before being absorbed than does light of shorter wavelengths. When the light is absorbed in the detector diode and charge carriers are created therein, the carriers, which are holes and electrons, must diffuse to the junction region within the diode before a bias is created to cause the diode to conduct. In other words, the invention is not concerned with the photoconductive effect within the material of the detector diode, but a junction effect, wherein the characteristics of the junction are altered when current carriers created by absorption of photons are collected at the junction. Thus the light must be absorbed in the detector diode within the diffusion length of the minority carriers produced thereby from the junction. For longer wavelength light, the junction at which the carriers are collected must be at a relatively large depth below the surface of the diode in order that the majority of carriers produced by the light be collected. In other words, more depth of material is required before all of the light impinging on the surface of the diode is absorbed, although a percentage of the light will be absorbed in each successive unit thickness of the diode body. Thus, the region over which the light is absorbed is relatively wide, and in order to insure the efficient collection at the junction of the majority of charge carriers generated thereby, relatively high lifetime material is used in the diode body. However, high lifetime material increases the diffusion time of the charge carriers from their point of origination to the junction, therefore decreasing the speed at which the diode is forward biased by the light. Conversely, by using optical radiation of shorter wavelength, the junction depth and lifetime of the semiconductor material can be correspondingly decreased without decreasing the collection efficiency, such as by the use of a light emitting diode comprised of $GaAs_{0.6}P_{0.4}$, for example.

A side elevational view in section of one embodiment of a portion of the coupling system of the invention that includes the solid-state light source and a detector diode is shown in FIGURE 5, which comprises a diffused photosensitive semiconductor detector diode 40 of planar construction and another light emitting semiconductor junction diode optically coupled thereto. The diode 40 is comprised of semiconductor material such as germanium or silicon and contains a p-n rectifying junction therein. There is also shown in FIGURE 5 a suitable structure for mounting the components to provide the necessary optical coupling therebetween. The light emitting junction diode comprises a hemispherical semiconductor region 50 of a first conductivity type and a smaller region 52 of an opposite conductivity type contiguous therewith. An electrical connection 56 is made to the region 52 and constitutes the anode of the junction diode, and the flat side of the region 50 is mounted in electrical connection with a metallic plate 58 with the region 52 and lead 56 extending into and through a hole in the plate. An electrical lead 57 is provided to the metallic plate 58 and constitutes the cathode of the diode. The diode is fabricated by any suitable process, such as, for example, by the diffusion process described in the last-mentioned earlier co-pending application or by an epitaxial process, to be described hereinafter, and contains a p-n rectifying junction 54 at or near the boundary between the regions 50 and 52.

The photosensitive diode 40 comprises a semiconductor wafer 42 of a first conductivity type into which an impurity of the opposite conductivity determining type is diffused to form a circular region 44 separated from the wafer of first conductivity type by the rectifying junction 43. The diode shown is preferably of planar construction with which those skilled in the art are familiar. An electrical connection is made to the wafer 42 by means of a wire 46, and another electrical connection is made to the region 44 by means of wire 48.

Another plate 60 is mounted about the light emitting diode and defines a hemispherical reflector surface 64 about the hemispherical dome 50. The detector diode 40 is mounted above the hemispherical dome with the region 44 facing the dome. A light transmitting medium 62 is used to fill the region between the reflector and the dome and for mounting the detector diode above the dome, wherein the light transmitting medium acts as a cement to hold the components together. Ample space is provided between the top of the reflector plate 60 and the detector diode for passing the lead 48 from the region 44 between the reflector plate and diode 40 without being electrically shorted to either. The lead is held in place by the cement-like transmitting medium. When a forward bias curent is passed through the junction of the light emitting diode between the anode 56 and the cathode 57, light is emitted at the junction 54, travels through the dome 50 and light transmitting medium 62 and strikes the surface of the detector diode, where a sufficient amount is absorbed in the region of the junction 43 to cause the diode to conduct.

The hemispherical dome structure is preferably used in order to realize the highest possible quantum efficiency. If the proper ratio of the radius of the junction 54 to the radius of the hemispherical dome is selected, then all of the internally generated light that reaches the surface of the dome has an angle of incidence less than the critical angle and can be transmitted. The maximum radius of the diode junction with respect to the dome radius depends on the refractive index of the coupling medium, and since all of the light strikes the dome surface close to the normal, a quarter wavelength antireflection coating will almost completely eliminate reflection at the dome surface. The maximum radius of the light emitting diode junction to the dome radius is determined by computing the ratio of the index of refraction of the coupling medium to the index of refraction of the dome material.

The dome, as shown in FIGURE 5, has a quarter wavelength antireflection coating 68 thereon comprised of zinc-sulfide to eliminate any possible reflection. A true hemispherical dome is optimum, because it gives the least bulk absorption to all spherical segments which radiate into a solid angle of $2\pi$ steradians or less. Spherical segments with height greater than their radius radiate into a solid angle less than $2\pi$ steradians, but have higher bulk absorption. Spherical segments with height less than either radius have less absorption but emit into a solid angle greater than $2\pi$ steradians and, therefore, direct a portion of the radiation away from the detector. Due to the presence of bulk absorption, the dome radius should be as small as possible to further increase the quantum efficiency of the unit.

The photosensitive detector diode 40 has a radius of about 1.5 times the radius of the hemispherical dome, which allows all the light emitted by the dome to be directed toward the detector by the use of a simple spherical reflecting surface 64. Since most of the light from the hemispherical dome strikes the detector diode surface at high angles of incidence, an anti-reflection coating on the detector is not essential and can be considered optional. The light transmitting medium 62 between the dome and the detector diode should have an index of refraction high enough with respect to the indices of refraction of the dome and the detector diode to reduce internal reflections, and to allow the ratio of the junction radius of the light emitting diode to the dome radius to be increased. The medium should also "wet" the surfaces of the source and the detector so that there are no voids which would destroy the effectiveness of the coupling medium. The indices of refraction of the light emitting diode and the detector diode are each about 3.6. A resin such as Sylgard, which is a trade name of the Dow Corning Corporation of Midland, Mich., has an index of refraction of about 1.43 and is suitable for use as a light transmitting medium. Although this index is considerably lower than 3.6, it is difficult to find a "transparent" substance that serves this purpose with a higher index. In order to insure the highest reflectivity, the reflector surface 64 is provided with a gold mirror 66 which can be deposited by plating, evaporation, or any other suitable process.

The metallic plates 58 and 60 are preferably comprised of a metal or alloy having the same or similar coefficient of thermal expansion as the light emitting diode, such as Kovar, for example. Similarly, the coupling medium 62 preferably has the same or similar coefficient of thermal expansion, or alternately remain pliable over a wide, useful temperature range of normal operation. Again, Sylgard satisfies this requirement by being pliable.

Various compositions of the light emitting diode and photosensitive detector diode have been mentioned in conjunction with the graphs of FIGURE 4, wherein the preferred compositions depend upon several factors including the absorption coefficient of the photosensitive diode, the ultimate efficiency to be achieved from the light emitting diode, and other factors, as will be presently described. One factor to be considered is the speed of response of the photosensitive diode to the optical radiation, wherein it has been seen that light of shorter wavelength gives a faster switching time because of the greater coefficient of absorption of the detector. This factor, if considered by itself, would indicate that a light emitting diode comprised of a material which generates the shortest possible wavelength is preferred. However, the efficiency of the light source must also be considered, in which the over-all efficiency can be defined as the ratio of the number of photons of light emerging from the dome to the number of electrons of current to the input of the diode, and the internal efficiency is the ratio of the number of photons of light generated in the diode to the number of input electrons.

It was pointed out in the above co-pending application that, in most cases, less of the light generated internally in the light emitting diode is absorbed per unit distance in the n-type region than in the p-type region. Moreover, n-type material can normally be made of higher conductivity than p-type material of the same impurity concentration. Thus, the dome is preferably of n-type conductivity material. In addition to this factor, it has been found that the greater the band gap of the material in which the light is generated, the shorter the wavelength of the light, wherein the frequency of the generated light is about equal to or slightly less than the frequency separation of the band gap. It has further been found that the light is absorbed to some extent in the material in which it is generated or in a material of equal or less band gap width, but is readily transmitted through a material having a band gap width at least slightly greater than the material in which the light is generated. In fact, a sharp distinction is observed between the efficient transmission of light through a composition whose band gap is slightly greater than the composition in which the light is generated, and through a composition having a band gap equal to or less than that of the generating composition. This implies that the light is readily transmitted through a material the frequency separation of the band gap of which is greater than the frequency of the generated light.

To take advantage of this knowledge, the light emitting diode, in the preferred embodiment, is comprised of two different compositions in which the junction at or near which the light is generated is located in a first region of the diode comprised of a material having a first band gap width and of p-type conductivity, and in which at least the major portion of the dome is comprised of a second material having a second band gap width greater than the first material and is of n-type conductivity. Thus, light generated in the first material has a wavelength which is long enough to be efficiently transmitted through the dome. There are several materials that have been found to be internally efficient light generators when a forward current is passed through a junction located therein, in addition to GaAs noted in the above co-pending application. The material indium-arsenide, InAs, has a band gap width of about .33 ev. and, if a p-n junction is formed therein, will generate light having a wavelength of about 3.8 microns, whereas light from GaAs is about .9 micron. The compositions $In_xGa_{1-x}As$, where $x$ can go from 0 to 1, give off light of wavelength which varies approximately linearly with $x$ between 3.8 microns for InAs when $x=1$ to .9 micron for GaAs when $x=0$. On the other side of GaAs is the composition gallium-phosphide, GaP, which has a band gap of about 2.25 ev. and emits radiation of about .5 micron. Also, the compositions $GaAs_xP_{1-x}$, where $x$ can go from 0 to 1, give off light of wavelength which varies approximately linearly with $x$ between .9 micron for GaAs when $x=1$ to .5 micron for GaP when $x=0$. It has been found, however, that for various reasons, the internal efficiency of light generation begins to drop off when the band gap of the material used is as high as about 1.8 ev., which approximately corresponds to the composition $GaAs_{0.6}P_{0.4}$, for $x$ equal to or less than about 0.6 for the compositions $GaAs_xP_{1-x}$.

Referring again to the FIGURE 5 and more specifically to the construction of the light emitting diode, a preferred embodiment comprises a dome 50 of n-type conductivity material with a smaller region 52 contiguous therewith in which a portion is of p-type conductivity. The region 52 is comprised of a composition having a first band gap width, and the dome 50 is comprised of a region having a second band gap width greater than that of region 52. The rectifiying junction 54 is formed in the region 52 of smaller band gap width so that the light generated herein will be efficiently transmitted through the dome.

The portion of region 52 between the junction 54 and the dome is of n-type conductivity. Referring to the graphs of FIGURE 4 and the foregoing discussion, a preferred composition for the region 52 is one which will generate as short a wavelength as possible in order to have a high coefficient of absorption in the photosensitive diode for fast switching action, and yet which will be efficiently transmitted by the dome 50. At the same time, the composition of region 52 should have a high internal efficiency as a light generator. The composition $GaAs_{0.6}P_{0.4}$ will efficiently produce light of wavelength of about .69 micron and constitutes a preferred material for the smaller region 52. By making the dome of a composition of band gap slightly greater than that of the region 52, such as $GaAs_{0.5}P_{0.5}$, for example, or for $x$ equal to or less than 0.5 for the compositions $GaAs_xP_{1-x}$, the light will be sufficiently transmitted. It should be noted that although the dome is comprised of a composition that does not have a high internal efficiency of light generation, this is unimportant, since the light is actually generated in the smaller region 52 of high efficiency. Thus, the dome material can be extended to compositions of relatively high band gap widths, even to GaP, without decreasing the over-all efficiency of the unit.

Other compositions and combinations thereof can be used, such as various combinations of $In_xGa_{1-x}As$ or $GaAs_xP_{1-x}$, or both. In addition, most III–V compounds can be used, or any other material which generates light by a direct recombination process when a forward current is passed through a rectifying junction therein. Moreover, the entire light emitting diode can be comprised of a single composition such as, for example, GaAs as described in the above co-pending application. It can, therefore, be seen how the compositions of the various components of the system can be varied to achieve various objectives, including the highest over-all efficiency of the entire system. Undoubtedly, other suitable compositions and combinations thereof will occur to those skilled in the art.

The light emitting diode can be made by any suitable process. For example, if two different compositions are used, a body or wafer constituted of a single crystal of one of the compositions can be used as a substrate onto which a single crystal layer of the other composition is deposited by an epitaxial method, which method is well known. Simultaneous with or subsequent to the epitaxial deposition, the rectifying junction can be formed in the proper composition, slightly removed from the boundary between the two, by the diffusion of an impurity that determines the opposite conductivity type of the composition. By etching away most of the composition containing the junction, the small region 52 can be formed. If the entire light emitting diode is comprised of a single composition, a simple diffusion process can be used to form the junction. The shape of the dome is formed by any suitable method, such as, for example, by grinding or polishing the region 50.

Another embodiment of the invention is shown in FIGURE 6, which is an elevational view in section of a planar constructed light emitting diode optically coupled to a detector diode as shown in FIGURE 5. The light emitting diode comprises a wafer 70 of semiconductor material of a first conductivity type into which is diffused an impurity that determines the opposite conductivity type to form a region 72 of said opposite conductivity type separated from the wafer 70 by a rectifying junction 74. The wafer is etched to cut below the junction and form the small region 72. Alternatively, the region 72 can be formed by an epitaxial process. Electrical leads 76 and 78 are connected to the region 72 and wafer 70 as previously described.

The wafer 70 is not formed into a dome structure in this embodiment, but is left in a planar configuration and optically coupled to the detector, as shown, with a suitable coupling medium 62 as noted earlier. This embodiment is more expedient to fabricate, as can be readily seen, and thus is advantageous in this respect. As indicated above, the dome structure is used to realize a high quantum efficiency, since all of the internally generated light strikes the surface of the dome at less than the critical angle, and thus little, if any, light is lost to internal reflections within the dome. This is not necessarily the case in the planar embodiment of FIGURE 6, and in order to achieve a high quantum efficiency, the diameter of the apparent light emitting surface of wafer 70, assuming a circular geometry, can be made somewhat smaller than the combined diameters or lateral dimensions across the two emitters of the detector. The apparent light emitting surface of the diode is determined by the thickness of wafer 70, the area of the light emitting junction 74, and the critical angle for total internal reflection. The critical angle of reflection is determined by computing the arcsine of the ratio of the index of refraction of the coupling medium 62 to the index of refraction of the semiconductor wafer 70.

In the preceding discussions, it was noted that a coupling medium having a suitable index of refraction is preferably used between the light emitting diode and the detector. If such a medium is used, it should have a high index to match, as closely as possible, that of the two components between which it is situated. Materials other than Sylgard can also be used, such as a high index of refraction glass. However, it can prove expedient and desirable in certain cases to couple the two components together with air, where a physical coupling is either impractical or impossible, and such a system is deemed to be within the intention of the present invention.

Although the preferred embodiment of the light emitting diode contains the junction in the region 52 below the boundary between the two regions 50 and 52, the junction can also be formed at this boundary or actually within the dome region 50 should this be more expedient for one or more reasons. In the case where the entire diode is comprised of a single composition, for example, an equally as efficient light emitter can be made by locating the junction other than as shown in the preferred embodiment.

Other modifications, substitutions and alternatives will undoubtedly occur that are deemed to fall within the scope of the present invention, which is intended to be limited only as defined in the appended claims.

What is claimed is:

1. An electro-optical coupling system, comprising:
(a) a first semiconductor device having a first region of a first conductivity type and a second region of an opposite conductivity type continguous to and forming a rectifying junction with said first region,
(b) said first device being characterized by the generation of optical radiation when a forward current is caused to flow through said rectifying junction,
(c) a transistor, and
(d) photosensitive means connected in electrical parallel with the emitter-base junction of said transistor and optically coupled to said first device for generating a forward bias current through said emitter-base junction in response to said optical radiation.

2. An electro-optical coupling system according to claim 1 wherein said photosensitive means comprises a pair of semiconductor junction diodes connected in electrical series with like polarities, the anode of one of said pair of diodes being electrically interconnected with the base region of said transistor and the cathode of the other of said pair of diodes being electrically interconnected with the emitter region of said transistor.

3. An electro-optical coupling system, comprising:
(a) a transistor,
(b) photosensitive means comprised of a first semiconductor material having at least one rectifying junction therein connected in electrical parallel with the emitter-base junction of said transistor,
(c) said photosensitive means being characterized by the absorption of optical radiation incident thereon which has a photon energy greater than the band gap energy of said first semiconductor material for generating excess minority charge carriers therein and being responsive to said excess minority charge carriers to produce a photocurrent for supplying a forward bias current through the emitter-base junction of said transistor when said optical radiation is absorbed within a minority carrier diffusion length from said at least one rectifying junction, and
(d) a semiconductor light emitting device, electrically isolated from but optically coupled to said photosensitive means for generating said optical radiation and having a first region of one conductivity type and a second region of an opposite conductivity type contiguous to and forming a rectifying junction with said first region,
(e) said light emitting device being characterized by the generation of said optical radiation when a forward current is caused to flow through the rectifying junction thereof,
(f) said optical radiation generated by said light emitting device being characterized by a photon energy greater than the band gap energy of said first semiconductor material in which at least a portion thereof is absorbed in said photosensitive means within a minority carrier diffusion length from said at least one rectifying junction.

4. An electro-optical coupling system, comprising:
(a) a transistor,
(b) first and second photosensitive junction diodes comprised of a first semiconductor material connected in electrical series with like polarities with the anode region of said first diode electrically interconnected with the base region of said transistor and the cathode region of said second diode electrically interconnected with the emitter region of said transistor,
(c) said first and second diodes being characterized by absorption of optical radiation incident thereon which has a photon energy greater than the band gap energy of said first semiconductor material for generating excess minority charge carriers therein and being responsive to said excess minority charge carriers to poduce a photocurrent for supplying a forward bias current through the emitter-base junction of said transistor when said optical radiation is absorbed within a minority carrier diffusion length from the junctions of said first and second diodes, and
(d) first and second semiconductor light emitting devices electrically isolated from but optically coupled to said first and second diodes, respectively, for generating optical radiation which is directed on said first and second diodes and each having a first region of one conductivity type and a second region of an opposite conductivity type contiguous to and forming a rectifying junction with said first region,
(e) each of said first and said second light emitting devices being characterized by the generation of said optical radiation when a forward current is caused to flow through the rectifying junction thereof,
(f) said optical radiation generated by said first and said second light emitting devices being characterized by a photon energy greater than the band gap energy of said first semiconductor material in which at least a portion thereof is absorbed in said first and said second diodes within a minority carrier diffusion length from the junctions thereof.

5. An electro-optical coupling system according to claim 4 including a first electrical circuit interconnected with the emitter region and collector region of said transistor with a load connected in series with said collector region and a source for applying a potential bias to the collector-base junction of said transistor.

6. An electro-optical coupling system according to claim 4 wherein each of said first and said second photosensitive diodes has a planar, exterior surface facing said first and said second light emitting devices, respectively, with the junctions of said first and said second diodes substantially parallel to said exterior surface.

7. An electro-optical coupling system according to claim 4 wherein said first region and a portion of said second region of each of said first and said second light emitting devices are comprised of a second semiconductor material having a band gap energy greater than that of said first semiconductor material, and the rest of said second region of each of said first and said second light emitting devices is comprised of a third semiconductor material having a band gap energy greater than that of said second semiconductor material, with said second regions of said first and said second light emitting devices being disposed between said first regions thereof and said first and said second photosensitive diodes, respectively.

8. An electro-optical coupling system according to claim 6 wherein said rectifying junctions of said first and said second light emitting devices are substantially parallel to said exterior surfaces of said first and said second photosensitive diodes, respectively, with said second regions of said first and said second light emitting devices being disposed between said first regions thereof and said first and said second photosensitive diodes, respectively.

9. An electro-optical coupling system according to claim 8 wherein each of said second regions of said first and said second light emitting devices defines a hemisphere with said rectifying junctions thereof being substantially parallel to the respective bases of said hemispheres.

10. An electro-optical coupling system according to claim 9 including reflecting surfaces disposed laterally about each of said hemispheres for directing said optical radiation on said surfaces of said first and said second photo-sensitive diodes.

11. An electro-optical coupling system according to claim 8 wherein said second regions of said first and said second light emitting devices define planar surfaces facing said first and said second photosensitive diodes, respectively.

12. An electro-optical coupling system according to claim 4 wherein said rectifying junctions of said first and said second light emitting devices are located within a second semiconductor material selected from the group consisting of III–V compounds of the periodic table and mixed combinations thereof, and said first semiconductor material is selected from the group consisting of silicon and germanium.

References Cited by the Examiner

UNITED STATES PATENTS

| | | | |
|---|---|---|---|
| 2,861,165 | 11/1958 | Aigrain et al. | 313—108 |
| 2,964,653 | 12/1960 | Cagle et al. | 307—88.5 |
| 2,976,527 | 3/1961 | Smith | 307—88.5 |
| 3,028,500 | 4/1962 | Wallmark | 250—2115 |
| 3,043,958 | 7/1962 | Diemer | 250—2115 |
| 3,104,323 | 9/1963 | Over et al. | 307—88.5 |

OTHER REFERENCES

"Infrared and Visible Light Emission from Forward-Biased P–N Junctions" by R. H. Rediker, Solid State Design, August 1963, pp. 19 and 20.

"Optical Coupling, New Approach to Microcircuit Interconnections," by Gilleo and Last, Electronics, Nov. 22, 1963, pp. 23 and 24.